(12) United States Patent
Sakamoto et al.

(10) Patent No.: US 12,107,379 B2
(45) Date of Patent: Oct. 1, 2024

(54) LASER DEVICE

(71) Applicant: Fujikura Ltd., Tokyo (JP)

(72) Inventors: Shinichi Sakamoto, Sakura (JP);
Yasuto Chiba, Sakura (JP); Wataru Kiyoyama, Sakura (JP); Yutaka Yamaguchi, Sakura (JP); Takashi Hasunuma, Sakura (JP)

(73) Assignee: Fujikura Ltd., Tokyo (JP)

( * ) Notice: Subject to any disclaimer, the term of this patent is extended or adjusted under 35 U.S.C. 154(b) by 641 days.

(21) Appl. No.: 17/422,267

(22) PCT Filed: Feb. 27, 2020

(86) PCT No.: PCT/JP2020/008039
§ 371 (c)(1),
(2) Date: Jul. 12, 2021

(87) PCT Pub. No.: WO2020/175622
PCT Pub. Date: Sep. 3, 2020

(65) Prior Publication Data
US 2022/0094132 A1 Mar. 24, 2022

(30) Foreign Application Priority Data
Feb. 27, 2019 (JP) ................. 2019-034377

(51) Int. Cl.
*H01S 3/094* (2006.01)
*B23K 26/70* (2014.01)
(Continued)

(52) U.S. Cl.
CPC ...... *H01S 3/094053* (2013.01); *B23K 26/705* (2015.10); *H01S 3/0014* (2013.01); *H01S 3/005* (2013.01); *H01S 3/06708* (2013.01)

(58) Field of Classification Search
CPC .. H01S 3/005; H01S 3/0014; H01S 3/094053; B23K 26/705
See application file for complete search history.

(56) References Cited

U.S. PATENT DOCUMENTS 6,275,250 B1 * 8/2001 Sanders ............... B23K 26/032
347/237
6,490,389 B1 12/2002 Goodwin et al.
(Continued)

FOREIGN PATENT DOCUMENTS

CN 204621354 U 9/2015
JP 2007-514117 A 5/2007
(Continued)

OTHER PUBLICATIONS

International Search Report issued in International Application No. PCT/JP2020/008039, mailed on Jun. 2, 2020 (3 pages).
(Continued)

*Primary Examiner* — Michael Carter
(74) *Attorney, Agent, or Firm* — Osha Bergman Watanabe & Burton LLP (57) ABSTRACT

A laser device includes at least one light source; a delivery fiber that is configured to propagate of laser light emitted from the light source; and a first light detection unit and a second light detection unit configured to detect a part of light propagating in a direction opposite to a propagation direction of the laser light through the delivery fiber. The first light detection unit detects first light included in a wavelength band of visible light. The second light detection unit detects second light included in a wavelength band of near-infrared light.

21 Claims, 6 Drawing Sheets

(51) Int. Cl.
    H01S 3/00      (2006.01)
    H01S 3/067     (2006.01)

(56)            References Cited

U.S. PATENT DOCUMENTS

|  |  |  |  |
|---|---|---|---|
| 6,628,871 B2 | 9/2003 | Maroney et al. | |
| 8,811,434 B2* | 8/2014 | Miyato | ............... H01S 3/10015 |
|  |  |  | 372/38.1 |
| 10,175,099 B2 | 1/2019 | Wang et al. | |
| 2009/0129410 A1* | 5/2009 | Teshima | ............ H01S 3/094003 |
|  |  |  | 372/6 |
| 2010/0272134 A1 | 10/2010 | Blanding et al. | |
| 2013/0188178 A1 | 7/2013 | Keen | |
| 2015/0214692 A1* | 7/2015 | Miyato | ............... H01S 3/06716 |
|  |  |  | 372/6 |

FOREIGN PATENT DOCUMENTS

| | | |
|---|---|---|
| JP | 2008-284030 A | 11/2008 |
| JP | 2012-127903 A | 7/2012 |
| JP | 2016-076598 A | 5/2016 |
| JP | 2017-059981 A | 3/2017 |
| JP | 2018-022101 A | 2/2018 |
| JP | 2018-082045 A | 5/2018 |
| WO | 2014/014068 A1 | 1/2014 |
| WO | 2017209989 A1 | 12/2017 |

OTHER PUBLICATIONS

International Search Report issued in International Application No. PCT/JP2020/080391, mailed on Jun. 2, 2020 (3 pages).

* cited by examiner

LASER DEVICE

CROSS-REFERENCE TO RELATED APPLICATIONS

Priority is claimed from Japanese Patent Application No. 2019-034377, filed Feb. 27, 2019, the content of which is incorporated herein by reference.

TECHNICAL FIELD

The present invention relates to a laser device.

BACKGROUND

Fiber laser devices used as laser beam machine for cutting or welding metal sheets propagates laser light into a delivery fiber and emits the laser light to the outside. In each fiber laser device, there is a case where the reflected light reflected from a workpiece returns toward the fiber laser device, causing damage to optical components such as an optical fiber and a laser diode (LD) due to unintended heating or the like. For this reason, it is necessary to accurately detect the amount of the reflected light and feed the amount back for the control of the laser light output.

In this respect, Patent Document 1 discloses a technique of monitoring both reflected light propagating in a core and reflected light propagating in a clad and feeding the reflected lights the back for the control of the laser light output.

PATENT LITERATURE

[Patent Document 1]
Japanese Unexamined Patent Application, First Publication No. 2018-82045

In the laser devices, a phenomenon referred to as "fiber fuse" is known in which once a fiber burns out, the core of the optical fiber is damaged toward a light source. When the fiber fuse has occurred, the optical components present from a point where the fuse has occurred to the light source are damaged. In recent years, the traveling speed of the fiber fuse has increased along with an increase in the output of a laser, and an area to be damaged in each device tends to increase when the fiber fuse has occurred. In this respect, the above-described Patent Document 1 monitors only the reflected light reflected from the workpiece as return light and feeds the reflected light back for the control of the laser light output. That is, detection of the fiber fuse is not considered in Patent Document 1. Since visible light emitted from the core heated to a high temperature when the fiber fuse has occurred and propagated to the light source side is different from the reflected light reflected from the workpiece in both wavelength band and power, it is difficult to accurately detect the visible light with a detector for detecting the reflected light. Therefore, in the laser device described in Patent Document 1, the return light cannot be accurately detected, and it is difficult to sufficiently protect the optical components.

SUMMARY

One or more embodiments of the invention provide a laser device capable of accurately detecting return light propagating through an optical fiber.

A laser device according to one or more embodiments of the invention includes at least one light source; a delivery fiber that is configured to propagate laser light emitted from the light source; and a first light detection unit (or "first light detector") and a second light detection unit (or "second light detector") configured to detect part of light propagating in a direction opposite to a propagation direction of the laser light through the delivery fiber, the first light detection unit detects first light included in a wavelength band of visible light, and the second light detection unit detects second light included in a wavelength band of near-infrared light.

According to one or more embodiments, the visible light accompanying the occurrence of the fiber fuse in the return light propagating from the delivery fiber to the light source side can be detected by the first light detection unit, and the reflected light reflected from a workpiece (the laser light emitted from the light source) can be detected by the second light detection unit. Accordingly, the return light propagating in the delivery fiber, which is an optical fiber of the laser device, can be accurately detected. Additionally, since the fiber fuse and the power of the reflected light can be independently detected, different control can be performed in a case where each is detected.

Additionally, the above laser device may further include a monitor fiber that is optically coupled to the delivery fiber and is configured to propagate part of the light propagating in the direction opposite to the propagation direction of the laser light in the delivery fiber, one end portion of the monitor fiber may be connected to the first light detection unit, and the second light detection unit may be a Rayleigh monitor disposed at a position facing an outer peripheral surface of the monitor fiber.

In a case where the fiber fuse has occurred in the delivery fiber, the visible light is generated in a core of the delivery fiber. According to one or more embodiments, part of the visible light propagates from the delivery fiber to the light source side inside the core of the delivery fiber. Part of the visible light propagating inside the core of the delivery fiber is coupled to the monitor fiber and propagated to the first light detection unit. In this way, since the visible light is propagated to the first light detection unit before the fiber fuse reaches the first light detection unit, the fiber fuse can be detected at an early stage. Additionally, since both the detection of the visible light and the detection of the reflected light can be performed from the monitor fiber, the total amount of the visible light amount and the reflected light amount can be grasped.

Additionally, since the generated visible light propagates to the first light detection unit while being confined inside the core of the delivery fiber and the core of the monitor fiber, a large amount of light received by the first light detection unit can be secured. Accordingly, the fiber fuse can be accurately detected.

Additionally, the first light detection unit preferentially detects the first light included in the wavelength band of the visible light over the second light included the wavelength band of the near-infrared light. Accordingly, in a case where the wavelength of the signal light output from the laser device is included in the wavelength band of the near-infrared light (for example, 1070 nm), even in a case where the return light of the signal light is propagated to the first light detection unit, the first light detection unit preferentially detects more visible light than the return light of the signal light. Therefore, the erroneous detection of the fiber fuse can be suppressed and the fiber fuse can be accurately detected.

Additionally, the first light detection unit may include a mirror in which a reflectance of the first light is lower than a reflectance of the second light and a transmittance of the first light is higher than a transmittance of the second light, and a photoelectric conversion unit (or "photoelectric converter") on which light transmitted through the mirror is incident.

According to one or more embodiments, the near-infrared light (second light) and the visible light (first light) can be separated from the light propagated to the first light detection unit, and then the separated visible light can be propagated to the photoelectric conversion unit. Accordingly, erroneous detection of the fiber fuse can be suppressed, and the fiber fuse can be accurately detected.

Additionally, the first light detection unit may include a mirror in which a reflectance of the first light is higher than a reflectance of the second light, and a photoelectric conversion unit on which light reflected by the mirror is incident.

According to one or more embodiments, the near-infrared light (second light) incident on the photoelectric conversion unit is reduced. Therefore, the ratio of the visible light (first light) to the light incident on the photoelectric conversion unit can be increased. Accordingly, erroneous detection of the fiber fuse can be suppressed, and the fiber fuse can be accurately detected.

Additionally, in the mirror, the transmittance of the second light may be higher than the transmittance of the first light, and in a case where the first light detection unit is viewed in a plan view, an inclination angle of an inner wall surface of the first light detection unit that light transmitted through the mirror reaches with respect to a direction in which the light transmitted through the mirror propagates may be larger than 0° and less than 90°.

According to one or more embodiments, it is possible to suppress a phenomenon in which the near-infrared light (second light) transmitted through the mirror is reflected by the inner wall surface of the first light detection unit and returned to the monitor fiber side. Accordingly, the generation of heat in the vicinity of the monitor fiber can be suppressed.

Additionally, in the mirror, the transmittance of the second light may be higher than the transmittance of the first light, and in a case where the first light detection unit is viewed in a plan view, an inner wall surface of the second light detection unit that light transmitted through the mirror reaches may be a curved surface.

According to one or more embodiments, it is possible to suppress a phenomenon in which the near-infrared light (second light) transmitted through the mirror is reflected by the inner wall surface of the first light detection unit and returned to the monitor fiber side. Accordingly, the generation of heat in the vicinity of the monitor fiber can be suppressed.

Additionally, in a case where the first light detection unit is viewed in a plan view, an incident surface of the mirror may be inclined by 45° with respect to a propagation direction of light emitted from the monitor fiber.

According to one or more embodiments, in a case where the first light detection unit is viewed in a plan view, the position of the photoelectric conversion unit can be disposed in a propagation direction of the light incident from the monitor fiber to the first light detection unit or in a direction perpendicular to the light propagation direction of the light incident on the first light detection unit from the monitor fiber.

Additionally, in the photoelectric conversion unit, a photoelectric conversion efficiency of the wavelength band of the visible light may be higher than a photoelectric conversion efficiency of the wavelength band of the near-infrared light.

According to one or more embodiments, the visible light can be preferentially converted into a photoelectric current over the near-infrared light, and the fiber fuse can be accurately detected.

The second light may be a laser light emitted from the light source.

According to one or more embodiments, even in a case where the return light of the laser light emitted from the light source is propagated to the first light detection unit, the first light detection unit can preferentially detect the visible light over the return light of the laser light by virtue of the above-described embodiments. Therefore, erroneous detection of the fiber fuse can be suppressed, and the fiber fuse can be accurately detected.

The laser device may further include a plurality of input fibers optically coupled to a plurality of the light sources; and a bridge fiber having an incident end face and an exit end face and in which the plurality of input fibers are connected to the incident end face, one end face of the monitor fiber may be connected to the incident end face of the bridge fiber, and one end face of the delivery fiber may be connected to the exit end face of the bridge fiber.

According to one or more embodiments, an empty port of the bridge fiber where the lights from the plurality of light sources are combined together can be used as the monitor fiber. Therefore, it is not necessary to use an optical coupler for the delivery fiber to branch the light for the monitor, and a configuration can be simplified. Additionally, since the laser light does not cause insertion loss due to the optical coupler, it is possible to suppress a decrease in the output of the laser light. Additionally, since heat is not generated due to the insertion loss of the optical coupler, the safety of the laser device can be enhanced.

Additionally, in a case where the incident end face of the bridge fiber is viewed in a plan view, one end face of the monitor fiber may be included in one end face of the delivery fiber.

According to one or more embodiments, the visible light propagating from the delivery fiber to the light source side (in the direction opposite to the propagation direction of the laser light) is likely to be coupled to the monitor fiber. For this reason, the fiber fuse can be stably detected.

Additionally, a filter that is disposed between the mirror and the photoelectric conversion unit and in which the transmittance of the first light included the wavelength band of the visible light is higher than the transmittance of the second light may be further provided.

According to one or more embodiments, since the laser light incident on the photoelectric conversion unit is reduced, it is possible to suppress erroneous detection of the fiber fuse to accurately detect the fiber fuse.

Additionally, in a case where the first light detection unit is viewed in a plan view, an inclination angle of an incident surface of the filter with respect to the propagation direction of the light incident on the photoelectric conversion unit may be larger than 0° and less than 90°.

According to one or more embodiments, the return of the light reflected by the filter to the monitor fiber side can be suppressed as compared to a case where the inclination angle of the incident surface of the filter with respect to the propagation direction of the light incident on the photoelectric conversion unit is 90°. Accordingly, the generation of heat in the vicinity of the end face of the monitor fiber can be suppressed.

The photoelectric conversion unit may include a transimpedance circuit that converts a current signal generated by the photodiode into a voltage signal, and the transimpedance circuit may include a low-pass filter that removes an AC component of the voltage signal.

In a case where machining is performed using the laser device, a plasma may be randomly generated depending on a machined state. According to one or more embodiments, a noise signal generated by the plasma light can be removed, and the fiber fuse can be accurately detected.

Additionally, the photoelectric conversion unit may include a photodiode, and in the photodiode, a photoelectric conversion efficiency of the first light may be higher than a photoelectric conversion efficiency of the second light.

According to one or more embodiments, the visible light (first light) can be preferentially converted into a photoelectric current over the near-infrared light (second light), and the fiber fuse can be accurately detected.

Additionally, the photoelectric conversion unit may include a transimpedance circuit that converts a current signal generated by the photodiode into a voltage signal, and the transimpedance circuit may include a low-pass filter that removes an AC component of the voltage signal.

In a case where machining is performed using the laser device, a plasma may be randomly generated depending on a machined state. According to one or more embodiments, a noise signal generated by the plasma light can be removed, and the fiber fuse can be accurately detected.

Additionally, an inner wall surface of the first light detection unit may be subjected to a damper treatment that converts incident light into heat.

According to one or more embodiments, the return of the light reflected by the inner wall surface of the first light detection unit to the monitor fiber side can be suppressed. Accordingly, the generation of heat in the vicinity of the end face of the monitor fiber can be suppressed.

Additionally, the laser device may further include a determination unit (or "determinator") that is configured to determine whether or not fiber fuse has occurred on the basis of a signal from the first light detection unit; and a control unit (or "controller") that is configured to control a power of the laser light output from the light source on the basis of the determination of the determination unit.

According to one or more embodiments, the output from the light source can be controlled when the fiber fuse has occurred. Accordingly, the safety of the laser device can be enhanced.

The power of the laser light may be 1 kW or more, and a time from when the determination unit determines that the fiber fuse has occurred until the control unit stops the power of the laser light may be 100 msec or less.

As the output of the laser increases, the traveling speed of the fiber fuse also increases. In particular, when the speed is 1 kW or more, the fuse runs at a speed of 10 m/s. According to one or more embodiments, the area damaged in the device when the fiber fuse has occurred can be reduced.

Additionally, the determination unit may determine whether or not reflected light exceeding a predetermined power is generated according to a signal from the second light detection unit.

In a case where it is determined that the reflected light exceeding the predetermined power is generated, the output from the light source can be controlled. Accordingly, the safety of the laser device can be enhanced.

Additionally, the delivery fiber may be a multimode fiber.

Advantageous Effects of Invention

According to the laser device, it is possible to detect the fiber fuse at an early stage.

DETAILED DESCRIPTION

Hereinafter, embodiments of a laser device according to the invention will be described in detail with reference to the drawings.

One Embodiment

A configuration of the laser device according to one or more embodiments will be described.

Figure 1:
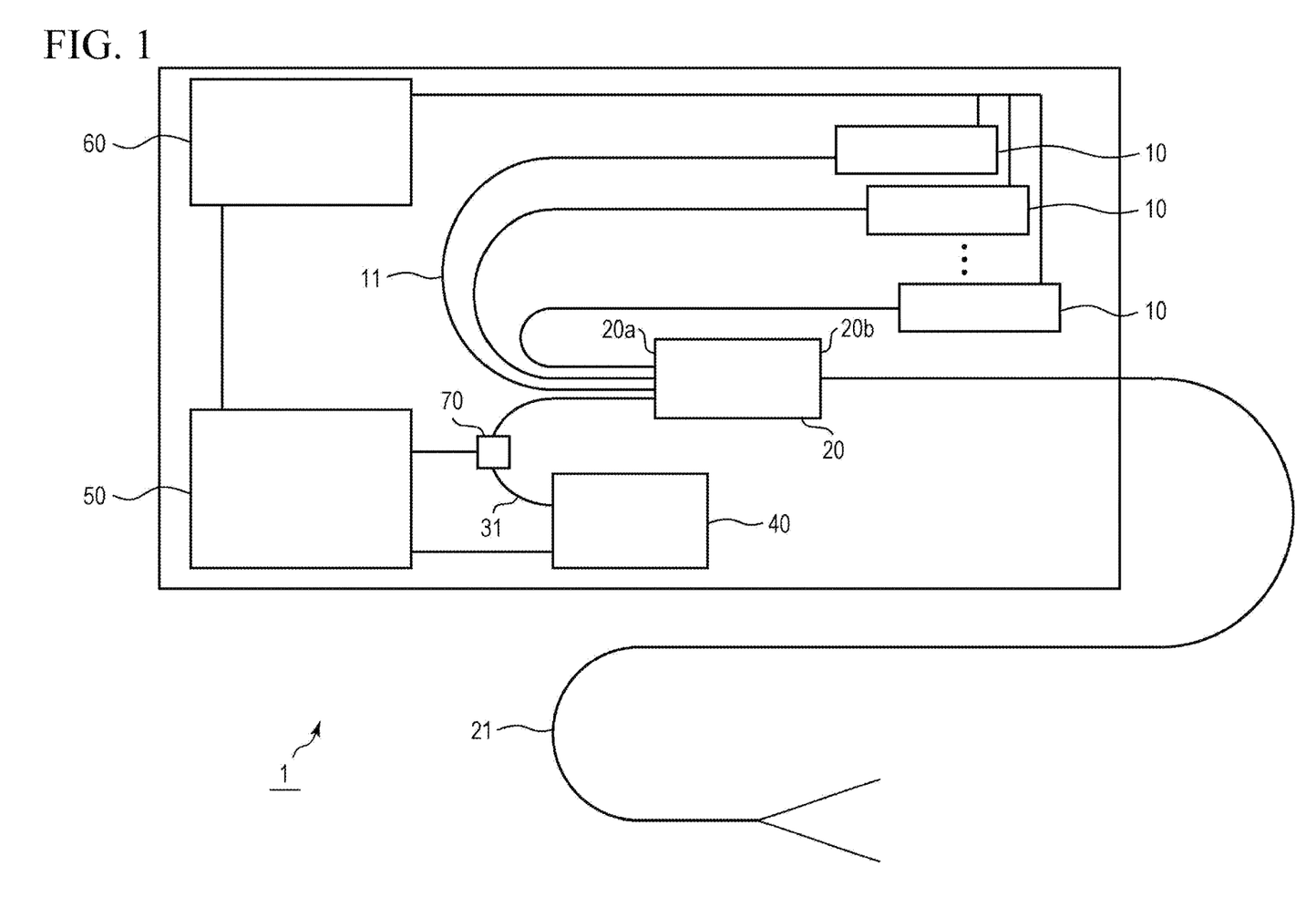
FIG. 1 is a conceptual diagram showing a laser device according to one or more embodiments of the invention.

FIG. 1 is a conceptual diagram showing a laser device according to a first embodiment of the invention. As shown in FIG. 1, a laser device 1 according to one or more embodiments includes a plurality of light sources 10, a bridge fiber 20, a delivery fiber 21, a monitor fiber 31, a first light detection unit 40, and a second light detection unit 70 as a main configuration. According to one or more embodiments, a multimode fiber is used as the delivery fiber 21.

Each light source 10 is a laser light source that emits signal light having a predetermined wavelength, and is, for example, a fiber laser device or a solid-state laser device. In a case where the light source 10 is the fiber laser device, the fiber laser device may be a resonator type fiber laser device or a master oscillator power amplifier (MO-PA) type fiber laser device. The signal light emitted from each of the light sources 10 is second light having a wavelength included in the near-infrared light, and according to one or more embodiments, is light having a wavelength of 1070 nm.

An input fiber (input fiber bundle) 11 that is configured to propagate laser light emitted from the light source 10 is connected to each light source 10. Each input fiber 11 is, for example, a few-mode fiber having a core diameter of about 20 μm. Therefore, the laser light emitted from each light source 10 propagates through each input fiber 11 in an LP mode of about 2 to 10.

The bridge fiber 20 is a member that connects cores of the plurality of input fibers 11 and a core of the delivery fiber 21. The bridge fiber 20 has an incident end face 20a to which the plurality of input fibers 11 are connected and an exit end face 20b to which the delivery fiber 21 is connected.

The laser lights propagating through the plurality of input fibers 11 are combined together by the bridge fiber 20 to generate output light. The generated output light propagates through the delivery fiber 21 and is output to the outside of the laser device. The power of the output light is, for example, 1 kW or more.

Here, in a case where a "fiber fuse" phenomenon occurs in the delivery fiber 21, visible light is emitted from the core heated to a high temperature when the fiber fuse has occurred. Part of the visible light propagates toward the light source 10 side (in a direction opposite to a propagation direction of the output light) inside the core of the delivery fiber 21. The visible light propagating through the delivery fiber 21 is incident on the exit end face 20b of the bridge fiber 20 and is further emitted from the incident end face 20a of the bridge fiber 20.

In this case, part of the visible light is coupled to a core of a monitor fiber 31 connected to the incident end face 20a of the bridge fiber 20, and part of the visible light propagating through the monitor fiber 31 is propagated to the first light detection unit 40. In this way, since the core of the delivery fiber 21 in which the fiber fuse has occurred and the first light detection unit 40 are optically coupled to each other, the visible light generated when the fiber fuse has occurred can be propagated to the first light detection unit 40. Since the visible light is propagated to the first light detection unit 40 before the fiber fuse reaches the first light detection unit 40, the fiber fuse can be detected at an early stage.

Additionally, since the generated visible light propagates to the first light detection unit 40 while being confined inside the core of the delivery fiber 21 and the core of the monitor fiber 31, a large amount of light received by the first light detection unit 40 can be secured. Accordingly, the fiber fuse can be accurately detected.

Additionally, in a case where the incident end face 20a of the bridge fiber 20 is viewed in a plan view from a direction along an optical axis, one end face of the monitor fiber 31 connected to the incident end face 20a of the bridge fiber 20 may be contained on one end face of the delivery fiber 21 connected to the exit end face 20b of the bridge fiber 20.

According to one or more embodiments, the visible light propagating from the delivery fiber 21 to the light source 10 side (in the direction opposite to the propagation direction of the laser light) is likely to be coupled to the monitor fiber 31. For this reason, the fiber fuse can be stably detected.

The visible light is photoelectrically converted in the first light detection unit 40. The photoelectrically converted visible light is input to a determination unit 50 as a monitor signal. Next, the determination unit 50 compares a predetermined threshold value with the value of the monitor signal. In a case where the value of the monitor signal exceeds the predetermined threshold value, the determination unit 50 determines that the fiber fuse has occurred. On the basis of the determination result, the control unit 60 controls the electric current of the light source 10 to cut off or reduce the output power of the light source 10.

According to the one or more embodiments, since the fiber fuse can be detected at an early stage, the control is performed, so that an area damaged in the laser device 1 when the fiber fuse has occurred can be reduced, and the cost associated with a repair such as component replacement can be reduced.

Additionally, the time from when the determination unit 50 determines that the fiber fuse has occurred until the control unit 60 stops the power of the laser light may be 100 msec or less. As the output of the laser increases, the traveling speed of the fiber fuse also increases. In particular, when the speed is 1 kW or more, the fuse runs at a speed of 10 m/s. According to one or more embodiments, the area damaged in the device when the fiber fuse has occurred can be further reduced.

There is a case where the output light output from the laser device 1 to the outside is reflected by an object to be irradiated with the laser light and returned to the laser device 1 as reflected light (hereinafter, reflected light). The reflected light is incident from the delivery fiber 21 and propagates toward the light source side (in the direction opposite to the propagation direction of the output light). Similar to the above-described visible light, the reflected light also propagates to the first light detection unit 40. Therefore, there is a possibility that the occurrence of the fiber fuse is erroneously detected.

Here, the first light detection unit 40 detects light including the first light in the wavelength band (400 nm to 700 nm) of the visible light. Specifically, the first light detection unit 40 preferentially detects the first light, which is the wavelength band of the visible light, over the second light, which is the wavelength band of the near-infrared light (800 to 2500 nm). For this reason, even in a case where the reflected light of the output light belonging to the wavelength band of the near-infrared light is propagated to the first light detection unit 40, the first light detection unit 40 preferentially detects more visible light than the reflected light. Therefore, the erroneous detection of the fiber fuse can be suppressed and the fiber fuse can be accurately detected.

In addition, although the first light detection unit according to one or more embodiments has a configuration in which the light propagating through the monitor fiber 31 is incident, the invention is not limited to this. The first light detection unit may be disposed at a position facing an outer peripheral surface of the monitor fiber 31 or the delivery fiber 21.

The second light detection unit 70 is disposed at a position facing the outer peripheral surface of the monitor fiber 31. The second light detection unit is a so-called Rayleigh monitor, which detects Rayleigh light of the light propagating through the monitor fiber 31.

The above Rayleigh monitor includes a photodiode and a transimpedance circuit that converts a photoelectric current generated by the photodiode into a voltage (monitor signal). Here, in the photodiode, the photoelectric conversion efficiency of the light (second light) included in the wavelength band of the near-infrared light is higher than the photoelectric conversion efficiency of the light (first light) included in the wavelength band of the visible light. For this reason, the near-infrared light can be preferentially converted into the monitor signal over the visible light. In this way, since the second light detection unit 70 can preferentially detect the light included in the wavelength band of the near-infrared light over the light included in the wavelength band of the visible light, it is possible to accurately detect the reflected light.

The light belonging to the wavelength band of the near-infrared light may be the laser light output from the light source 10. Accordingly, the reflected light reflected from a workpiece in the light incident on the photodiode can be preferentially converted into the monitor signal over the visible light.

The reflected light is photoelectrically converted in the second light detection unit 70. The photoelectrically converted reflected light is input to the determination unit 50 as the monitor signal. Next, the determination unit 50 compares a predetermined threshold value with the value of the monitor signal. In a case where the value of the monitor signal exceeds the predetermined threshold value, the determination unit 50 determines that the reflected light exceeding a predetermined power is generated, and the control unit 60 controls the electric current of the light source 10 on the basis of the determination result to cut off or reduce the output power of the light source 10.

Although the Rayleigh monitor of the second light detection unit 70 according to one or embodiments is disposed on a side of the monitor fiber 31, the Rayleigh monitor may be on a side of the delivery fiber 21. Additionally, although the second light detection unit 70 according to one or more embodiments is the Rayleigh monitor, the invention is not limited to this. The outermost clad of the monitor fiber 31 or the delivery fiber 21 may be covered with a refractive index higher than that of the clad to detect the reflected light propagating through the clad and the surface of the clad may be roughened to detect scattered light leaking from the clad as the reflected light. Additionally, the light propagating in the core of the monitor fiber 31 or the delivery fiber 21 may be partially branched by an optical coupler to detect the reflected light.

According to one or more embodiments, since the fiber fuse and the power of the reflected light can be independently detected, different control can be performed in a case where each is detected. For example, an alarm displayed on a display unit (not shown) may be different in a case where the fiber fuse is detected or in a case where the reflected light exceeding the predetermined power is detected.

When the second light detection unit 70 determines that the reflected light exceeding the predetermined power is generated in the determination unit 50, a threshold value for the monitor signal photoelectrically converted by the first light detection unit 40 may be lowered. Accordingly, it is possible to detect the fiber fuse at a higher speed.

There is a case where the output light of the laser device is positioned by connecting a light source, which emits the visible light (hereinafter referred to as a guide light source), to the incident end face 20a of the bridge fiber 20 via an optical fiber and outputting the visible light from the delivery fiber 21. In such a case, the control unit 60 may control the laser device to emit the output light after cutting off the output of the guide light source. Accordingly, the appearance of the visible light from the guide light source from appearing as noise in the monitor signal photoelectrically converted by the first light detection unit 40 can be suppressed. As a result, the determination unit 50 can lower the threshold value for the monitor signal photoelectrically converted by the first light detection unit 40, and it is possible to detect the fiber fuse at a higher speed.

First Light Detection Unit

Figure 2:
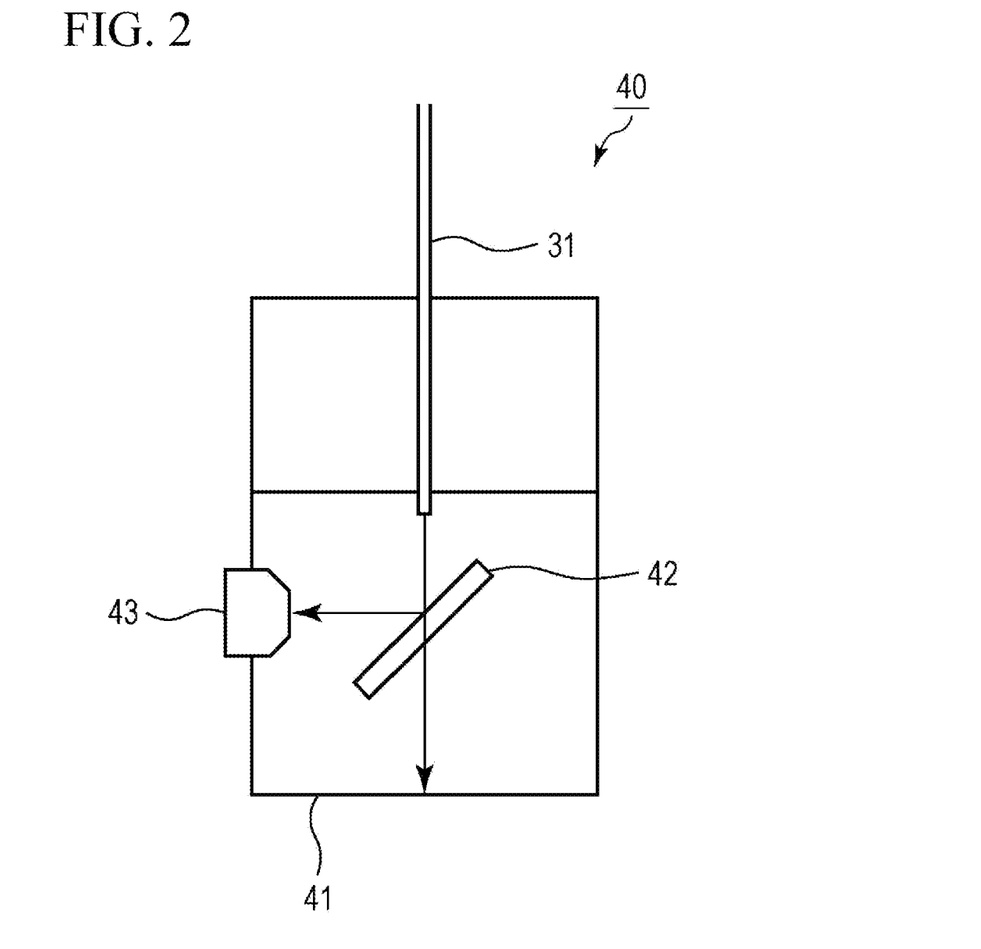
FIG. 2 is a conceptual diagram showing a first light detection unit according to one or more embodiments of the invention.

The first light detection unit 40 according to one or more embodiments will be described with reference to FIGS. 2 to 6. As shown in FIG. 2, the first light detection unit 40 includes a first light detection unit body 41, a photoelectric conversion unit 43, a visible light reflection type mirror 42, and part of the monitor fiber 31 as a main configuration. Additionally, the photoelectric conversion unit 43, the visible light reflection type mirror 42, and part of the monitor fiber 31 are disposed inside the first light detection unit body 41.

In addition, in FIGS. 2 to 6, the same or corresponding components will be designated by the same reference numerals, and duplicated description will be omitted.

As shown in FIG. 2, the light propagating through the monitor fiber 31 and incident on the first light detection unit 40 is incident on the visible light reflection type mirror 42. Additionally, an incident surface of the visible light reflection type mirror 42 is inclined by 45° with respect to the propagation direction of the light emitted from one end portion of the monitor fiber 31 in a case where the first light detection unit 40 is viewed in a plan view. Additionally, the photoelectric conversion unit 43 is disposed in a direction perpendicular to the propagation direction of the light incident on the first light detection unit from the monitor fiber 31 and in a direction in which the light reflected by the visible light reflection type mirror 42 propagates.

In the visible light reflection type mirror 42, the reflectance of the light belonging to the wavelength band of the visible light (first light) is higher than the reflectance of the light belonging to the wavelength band of the near-infrared light (second light). For that reason, the laser light belonging to the wavelength band of the visible light in the light incident on the visible light reflection type mirror 42 is reflected by the visible light reflection type mirror 42 and incident on the photoelectric conversion unit 43. According to one or more embodiments, the visible light in the light propagating through the monitor fiber 31 can be preferentially incident on the photoelectric conversion unit 43 over the near-infrared light.

The light belonging to the wavelength band of the near-infrared light may be the laser light output from the light source 10. The incidence of the above-described return light into the first light detection unit 40 can be suppressed, and the fiber fuse can be accurately detected.

The photoelectric conversion unit 43 converts the incident light (mainly visible light) into the monitor signal. The photoelectric conversion unit 43 includes a photodiode and a transimpedance circuit that converts a photoelectric current generated by the photodiode into a voltage (monitor signal). Here, in the photodiode, the photoelectric conversion efficiency of the light included in the wavelength band of the visible light is higher than the photoelectric conversion efficiency of the light included in the wavelength band of the near-infrared light. For this reason, the visible light can be preferentially converted into the monitor signal over the near-infrared light. Accordingly, it is possible to accurately detect the fiber fuse.

The light belonging to the wavelength band of the near-infrared light may be the laser light output from the light source 10. Accordingly, the visible light in the light incident on the photodiode can be preferentially converted into the monitor signal over the laser light, and the fiber fuse can be accurately detected.

Additionally, the transimpedance circuit of the photoelectric conversion unit 43 includes a low-pass filter that removes an AC component of the monitor signal. Specifically, a capacitor is inserted in parallel with a transimpedance resistor. In a case where machining is performed using the laser device, a plasma may be randomly generated depending on a machined state. According to one or more embodiments, noise caused by plasma light can be removed from the monitor signal, and the fiber fuse can be accurately detected.

Additionally, in the visible light reflection type mirror 42, the transmittance of the light (second light) belonging to the wavelength band of the near-infrared light is higher than the transmittance of the light (first light) belonging to the wavelength band of the visible light. More specifically, the transmittance of the laser light output from the light source 10 is higher than the transmittance of the light belonging to the wavelength band of the visible light. For that reason, the component of the return light (the component of the laser light output from the light source 10) in the light incident on the visible light reflection type mirror 42 is transmitted through the visible light reflection type mirror 42 and is incident on an inner wall surface of the first light detection unit body 41.

Here, the inner wall surface of the first light detection unit body 41 on which the light transmitted through the visible light reflection type mirror 42 is incident is subjected to black hard alumite treatment. Accordingly, the light incident on the inner wall surface is absorbed by the inner wall surface and converted into heat. Additionally, the inner wall surface of the first light detection unit body 41 on which the light transmitted through the visible light reflection type mirror 42 is incident is subjected to a matte (satin) treatment in which the surface is chemically roughened. Accordingly, the incident light can be scattered. In this way, damper treatment is performed such that the light incident on the inner wall surface of the first light detection unit body 41 is not returned to the monitor fiber 31, so that the heat generated in the vicinity of the monitor fiber 31 caused by the absorption of light into a coating of the monitor fiber or the like can be suppressed.

Figure 3:
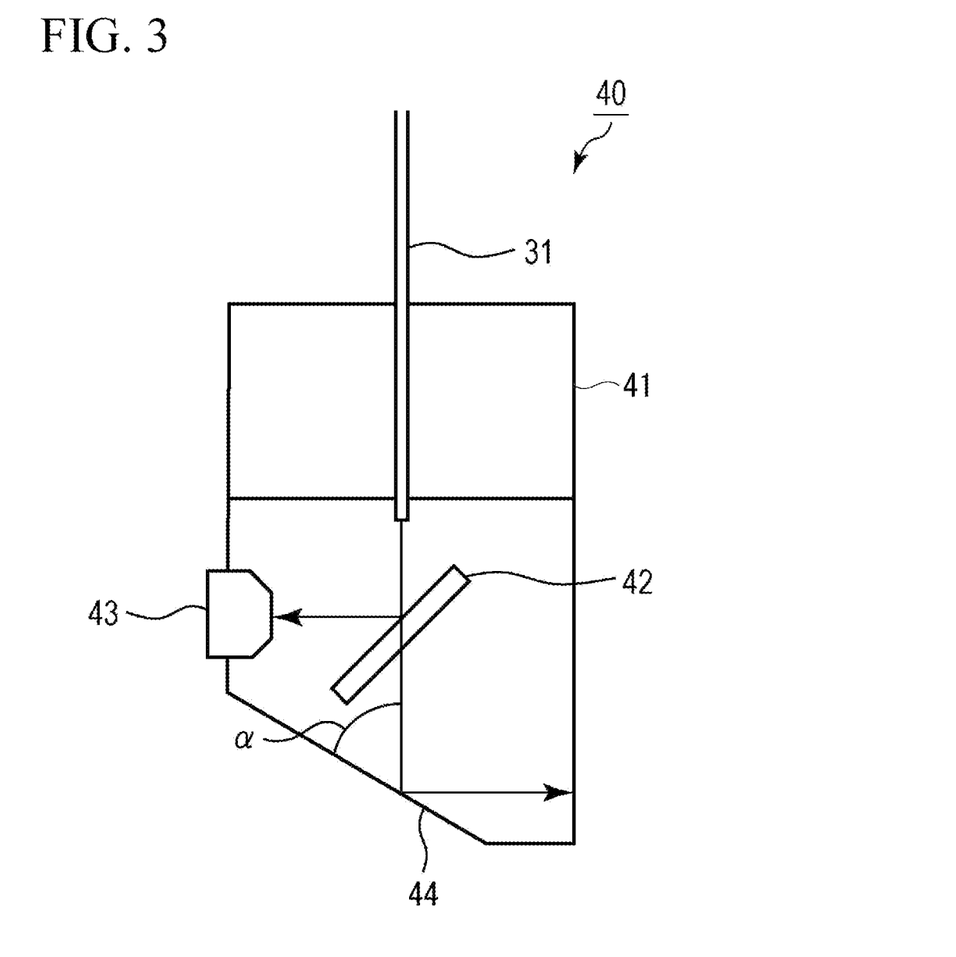
FIG. 3 is a conceptual diagram showing a modified example in which a part of the first light detection unit shown in FIG. 2 is modified.

Moreover, the first light detection unit 40 may have a structure that does not return the light incident on the inner wall surface of the first light detection unit body 41 to the monitor fiber 31. For example, as shown in FIG. 3, the first light detection unit 40 may be formed with an inclined surface (inner wall surface) 44 that is inclined with respect to the direction in which the light transmitted through the visible light reflection type mirror 42 propagates in a case where the first light detection unit 40 is viewed in a plan view. The light transmitted through the visible light reflection type mirror 42 reaches the inclined surface 44. The inclination angle α of the inclined surface 44 may be larger than 0° and less than 90°. According to one or more embodiments, it is possible to further suppress a phenomenon in which the near-infrared light transmitted through the visible light reflection type mirror 42 is reflected by the inner wall surface of the first light detection unit body 41 and returned to the monitor fiber side. Accordingly, the heat generated in the vicinity of the monitor fiber 31 can be suppressed.

Figure 4:
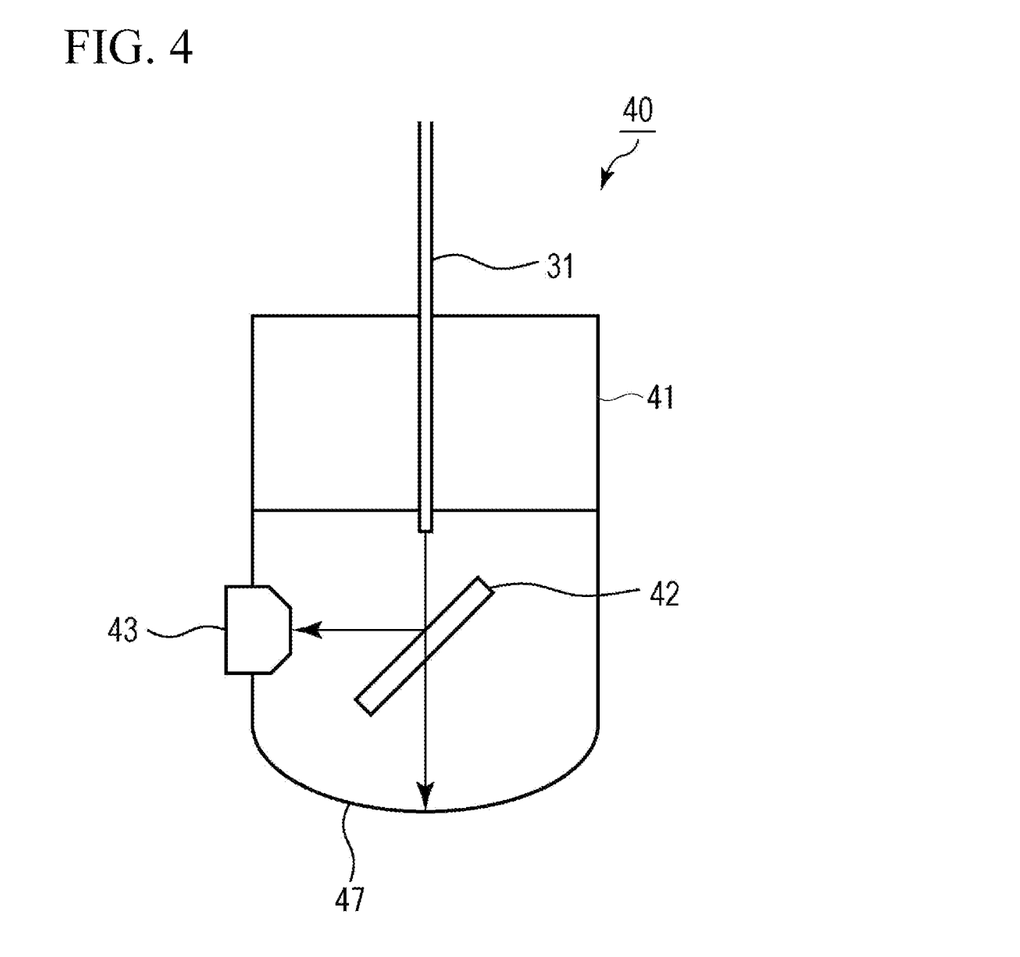
FIG. 4 is a conceptual diagram showing a modified example in which a part of the first light detection unit shown in FIG. 2 is modified.

Moreover, the first light detection unit 40 may have a structure for preventing the light incident on the inner wall surface of the first light detection unit body 41 from being returned to the monitor fiber 31. For example, as shown in FIG. 4, the first light detection unit 40 may be formed with a curved surface (inner wall surface) 47 that is curved with respect to the direction in which the light transmitted through the visible light reflection type mirror 42 propagates in a case where the first light detection unit 40 is viewed in a plan view. The light transmitted through the visible light reflection type mirror 42 reaches the curved surface 47. The curved surface 47 may have a curved surface shape that is convex toward the outside of the first light detection unit body 41. According to one or more embodiments, it is possible to suppress the phenomenon in which the near-infrared light transmitted through the visible light reflection type mirror 42 is reflected by the inner wall surface of the first light detection unit body 41 and returned to the monitor fiber side. Accordingly, the generation of heat in the vicinity of the monitor fiber can be suppressed.

Figure 5:
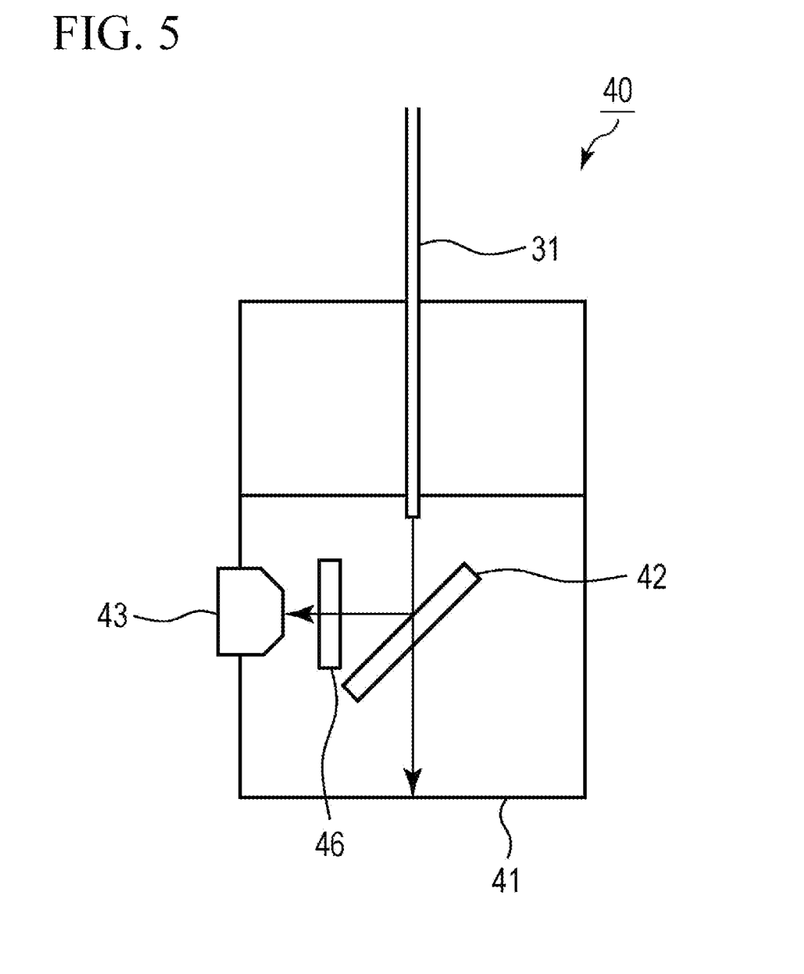
FIG. 5 is a conceptual diagram showing a modified example in which a part of the first light detection unit shown in FIG. 2 is modified.

Additionally, as shown in FIG. 5, as a structure for causing the visible light in the light propagating through the monitor fiber 31 to be preferentially incident on the photoelectric conversion unit 43 over the near-infrared light, a filter 46, which transmits the first light preferentially the first light having the wavelength band of the visible light over the laser light (in other words, the transmittance of the first light is higher than the transmittance of the second light), may be disposed between the visible light reflection type mirror 42 and the photoelectric conversion unit 43.

According to one or more embodiments, although the delivery fiber 21 has been described using the multimode fiber, the type of fiber is not particularly limited.

Modified Example of First Light Detection Unit

Figure 6:
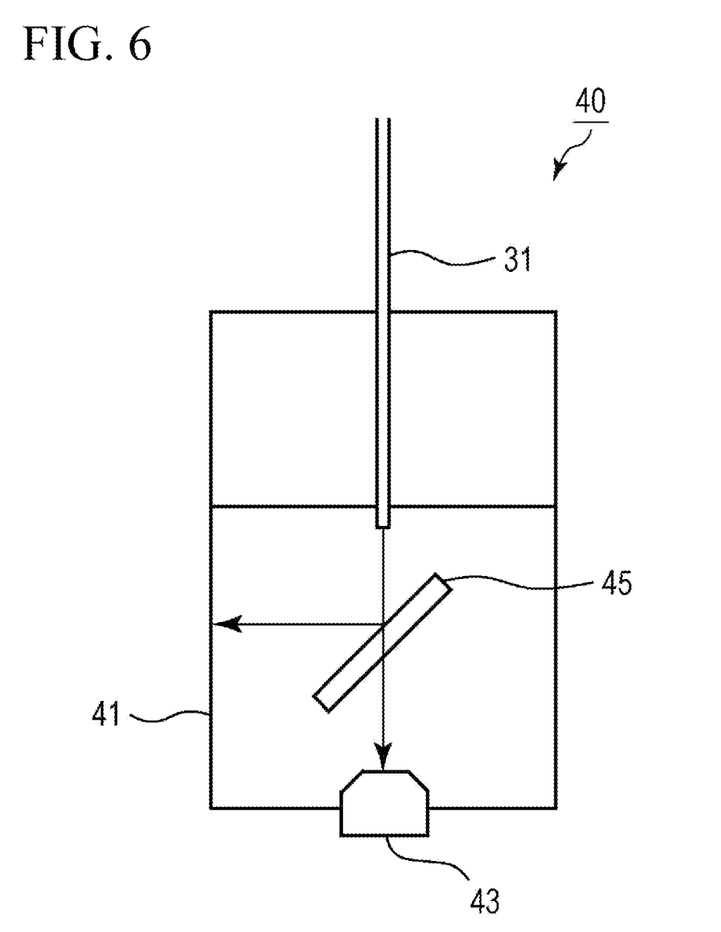
FIG. 6 is a conceptual diagram showing a modified example of the first light detection unit shown in FIG. 2.

FIG. 6 shows a modified example of the first light detection unit 40. As shown in FIG. 6, the light propagating through the monitor fiber 31 is incident on a near-infrared light reflection type mirror 45. Additionally, an incident surface of the near-infrared light reflection type mirror 45 is inclined by 45° with respect to the propagation direction of the light emitted from the monitor fiber 31 in a case where the first light detection unit 40 is viewed in a plan view. Additionally, the photoelectric conversion unit 43 is disposed in the propagation direction in which the light incident on the first light detection unit 40 from the monitor fiber 31 propagates and the light transmitted through the near-infrared light reflection type mirror 45 propagates. In addition, a filter for transmitting the light included in the wavelength band of the visible light may be further provided between the near-infrared light reflection type mirror 45 and the photoelectric conversion unit 43.

In the near-infrared light reflection type mirror 45, the reflectance of the light belonging to the wavelength band of the near-infrared light (first light) is higher than the reflectance of the light belonging to the wavelength band of the visible light (second light). For that reason, the light mainly belonging to the wavelength band of the near-infrared light (mainly the return light component of the laser light output from the light source) in the light incident on the near-infrared light reflection type mirror 45 is reflected by the near-infrared light reflection type mirror 45 and is incident on the inner wall surface of the first light detection unit body 41. The inner wall surface may be subjected to the damper treatment as described above.

Additionally, in the near-infrared light reflection type mirror 45, the transmittance of the light (first light) belonging to the wavelength band of the visible light is higher than the transmittance of the light (second light) belonging to the wavelength band of the near-infrared light. More specifically, the transmittance of the visible light is higher than the transmittance of the laser light output from the light source 10. For that reason, the component of the visible light in the light incident on the near-infrared light reflection type mirror 45 is transmitted through the near-infrared light reflection type mirror 45 and is incident on the photoelectric conversion unit 43.

According to one or more embodiments, the visible light in the light propagating through the monitor fiber 31 can be preferentially incident on the photoelectric conversion unit 43 over the near-infrared light.

The light belonging to the wavelength band of the near-infrared light described in the present modified example may be the laser light output from the light source 10.

Although the disclosure has been described with respect to only a limited number of embodiments, those skilled in the art, having benefit of this disclosure, will appreciate that various other embodiments may be devised without departing from the scope of the present invention. Accordingly, the scope of the invention should be limited only by the attached claims.

REFERENCE SIGNS LIST

1: Laser device
10: Light source

11: Input fiber
20: Bridge fiber
21: Delivery fiber
31: Monitor fiber
40: First light detection unit
42: Visible light reflection type mirror
43: Photoelectric conversion unit
45: Near-infrared light reflection type mirror
50: Determination unit
60: Control unit
70: Second light detection unit

What is claimed is:

1. A laser device comprising:
a light source;
a delivery fiber that propagates laser light emitted from the light source;
a first light detector and a second light detector that detect a part of light propagating in a direction opposite to a propagation direction of the laser light through the delivery fiber; and
a monitor fiber that:
is optically coupled to the delivery fiber, and
propagates part of the light propagating in the direction opposite to the propagation direction, wherein
one end portion of the monitor fiber is connected to the first light detector, and
the second light detector is a Rayleigh monitor that faces an outer peripheral surface of the monitor fiber,
the first light detector detects a first light in a wavelength band of visible light, and
the second light detector detects a second light in a wavelength band of near-infrared light.

2. The laser device according to claim 1, wherein the first light detector comprises:
a near-infrared light reflection type mirror that has:
a lower reflectance of the first light than the second light, and
a higher transmittance of the first light than the second light, and
a photoelectric converter on which light transmitted through the near-infrared light reflection type mirror is incident.

3. The laser device according to claim 2, wherein in a plan view of the first light detector, an incident surface of the near-infrared light reflection type mirror is inclined by 45° with respect to a propagation direction of light emitted from the monitor fiber.

4. The laser device according to claim 2, further comprising:
a filter that:
is disposed between the near-infrared light reflection type mirror and the photoelectric converter, and
has a higher transmittance of the first light than the second light.

5. The laser device according to claim 1, wherein the first light detector comprises:
a visible light reflection type mirror that has a higher reflectance of the first light than the second light, and
a photoelectric converter on which light reflected by the visible light reflection type mirror is incident.

6. The laser device according to claim 5, wherein
the visible light reflection type mirror has a higher transmittance of the second light than the first light,
the first light detector comprises an inner wall surface that receives light transmitted through the visible light reflection type mirror, and
in a plan view of the first light detector, an inclination angle of the inner wall surface, with respect to a direction in which the light transmitted through the visible light reflection type mirror propagates, is larger than 0° and less than 90°.

7. The laser device according to claim 5, wherein
the visible light reflection type mirror has a higher transmittance of the second light than the first light, and
the second light detector comprises an inner wall surface that receives light transmitted through the visible light reflection type mirror,
in a plan view of the first light detector, the inner wall surface is a curved surface.

8. The laser device according to claim 5, wherein in a plan view of the first light detector, an incident surface of the visible light reflection type mirror is inclined by 45° with respect to a propagation direction of light emitted from the monitor fiber.

9. The laser device according to claim 5, wherein the photoelectric converter has a higher photoelectric conversion efficiency in the wavelength band of the visible light the near-infrared light.

10. The laser device according to claim 5, further comprising:
a filter that:
is disposed between the visible light reflection type mirror and the photoelectric converter, and
has a higher transmittance of the first light than the second light.

11. The laser device according to claim 10, wherein in a plan view of the first light detector, an inclination angle of an incident surface of the filter with respect to a propagation direction of a light incident on the photoelectric converter is larger than 0° and less than 90°.

12. The laser device according to claim 5, wherein the photoelectric converter comprises:
a photodiode that has a higher photoelectric conversion efficiency of the first light the second light.

13. The laser device according to claim 12, wherein
the photoelectric converter comprises a transimpedance circuit that converts a current signal generated by the photodiode into a voltage signal, and
the transimpedance circuit comprises a low-pass filter that removes an AC component of the voltage signal.

14. The laser device according to claim 1, wherein an inner wall surface of the first light detector is treated with a damper treatment that converts incident light into heat.

15. The laser device according to claim 1, further comprising:
an input fiber bundle formed of a plurality of input fibers optically coupled to a plurality of the light sources; and
a bridge fiber comprising an incident end face and an exit end face, wherein the input fiber bundle is connected to the incident end face in the bridge fiber, one end face of the monitor fiber is connected to the incident end face of the bridge fiber, and one end face of the delivery fiber is connected to the exit end face of the bridge fiber.

16. The laser device according to claim 15, wherein in a plan view of the incident end face of the bridge fiber, one end face of the monitor fiber is included in one end face of the delivery fiber.

17. The laser device according to claim 1, wherein the second light is the laser light.

18. The laser device according to claim 1, further comprising:

a determinator that determines whether a fiber fuse has occurred based on a signal from the first light detector; and a controller controls a power of a laser light output from the light source based on the determination of the determinator.

19. The laser device according to claim 18, wherein
the power of the laser light is 1 kW or more, and
a time from the determinator determining the fiber fuse until the controller stops the power of the laser light is 100 msec or less.

20. The laser device according to claim 18, wherein the determinator determines whether reflected light exceeding a predetermined power is generated based on a signal from the second light detector.

21. The laser device according to claim 1, wherein the delivery fiber is a multimode fiber.

* * * * *